(12) United States Patent
Moyers et al.

(10) Patent No.: US 9,646,951 B2
(45) Date of Patent: May 9, 2017

(54) METHOD OF FORMING A SEMICONDUCTOR DEVICE AND STRUCTURE THEREFOR

(71) Applicant: SEMICONDUCTOR COMPONENTS INDUSTRIES, LLC, Phoenix, AZ (US)

(72) Inventors: Richard D. Moyers, Mesa, AZ (US); Sudhama C. Shastri, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 210 days.

(21) Appl. No.: 14/102,047

(22) Filed: Dec. 10, 2013

(65) Prior Publication Data

US 2015/0162305 A1  Jun. 11, 2015

(51) Int. Cl.
*H01L 23/00* (2006.01)
*H01L 21/78* (2006.01)
*H01L 21/3065* (2006.01)

(52) U.S. Cl.
CPC .......... *H01L 24/94* (2013.01); *H01L 21/3065* (2013.01); *H01L 21/78* (2013.01); *H01L 24/11* (2013.01); *H01L 24/13* (2013.01); *H01L 2224/02126* (2013.01); *H01L 2224/0401* (2013.01); *H01L 2224/05022* (2013.01); *H01L 2224/05073* (2013.01); *H01L 2224/05124* (2013.01); *H01L 2224/05147* (2013.01); *H01L 2224/05567* (2013.01); *H01L 2224/05573* (2013.01); *H01L 2224/05655* (2013.01); *H01L 2224/05666* (2013.01); *H01L 2224/05684* (2013.01); *H01L 2224/11019* (2013.01); *H01L 2224/1191* (2013.01); *H01L 2224/13013* (2013.01); *H01L 2224/13014* (2013.01); *H01L 2224/13017* (2013.01); *H01L 2224/13022* (2013.01); *H01L 2224/13144* (2013.01); *H01L 2224/13562* (2013.01); *H01L 2224/13611* (2013.01); *H01L 2224/81805* (2013.01); *H01L 2224/81815* (2013.01); *H01L 2224/94* (2013.01); *H01L 2924/0105* (2013.01); *H01L 2924/0132* (2013.01); *H01L 2924/01046* (2013.01); *H01L 2924/01051* (2013.01);
(Continued)

(58) Field of Classification Search
CPC ... H01L 2224/81931; H01L 2224/8193; H01L 2224/8192
See application file for complete search history.

(56) References Cited

U.S. PATENT DOCUMENTS 3,809,625 A * 5/1974 Brown ...................... C25D 3/56
205/103
3,986,255 A * 10/1976 Mandal ................. H01L 21/288
228/123.1
(Continued)

*Primary Examiner* — Robert Carpenter
(74) *Attorney, Agent, or Firm* — Robert F. Hightower

(57) ABSTRACT

In one embodiment, a conductor bump is formed on an under bump conductor of a semiconductor device to extend a first distance away from a surface of the under bump conductor including forming a protective layer on an outer surface of the conductor bump wherein the plurality of semiconductor dies are subsequently singulated by etching through the semiconductor substrate with an etchant and wherein the protective layer protects the conductor bump from the etchant.

13 Claims, 3 Drawing Sheets

(52) U.S. Cl.
CPC ............... *H01L 2924/01078* (2013.01); *H01L 2924/01079* (2013.01); *H01L 2924/1305* (2013.01); *H01L 2924/13091* (2013.01); *H01L 2924/20106* (2013.01); *H01L 2924/20107* (2013.01); *H01L 2924/20108* (2013.01)

(56) References Cited

U.S. PATENT DOCUMENTS

| | | | | |
|---|---|---|---|---|
| 4,005,472 | A * | 1/1977 | Harris | H01L 21/288 205/123 |
| 4,600,600 | A * | 7/1986 | Pammer | H01L 21/2885 205/123 |
| 5,272,376 | A * | 12/1993 | Ueno | H01L 23/53238 257/737 |
| 5,492,235 | A * | 2/1996 | Crafts | H01L 24/03 216/100 |
| 5,648,686 | A * | 7/1997 | Hirano | H01L 24/10 257/737 |
| 6,924,553 | B2 * | 8/2005 | Ohara | H01L 23/3171 257/674 |
| 7,759,776 | B2 * | 7/2010 | Cheng | G01R 1/07378 257/659 |
| 7,781,310 | B2 | 8/2010 | Grivna | |
| 7,985,661 | B2 | 7/2011 | Grivna | |
| 7,989,319 | B2 | 8/2011 | Grivna et al. | |
| 8,012,857 | B2 | 9/2011 | Grivna et al. | |
| 8,022,508 | B2 * | 9/2011 | Miki | H01L 22/34 257/620 |
| 8,546,254 | B2 * | 10/2013 | Lu | C25D 5/022 257/E21.479 |
| 8,598,016 | B2 * | 12/2013 | Yalamanchili | H01L 21/30655 257/E21.602 |
| 9,105,710 | B2 * | 8/2015 | Lei | H01L 21/78 |
| 2001/0013651 | A1 * | 8/2001 | Nakazawa | H01L 24/11 257/737 |
| 2011/0177675 | A1 | 7/2011 | Grivna et al. | |
| 2011/0244657 | A1 | 10/2011 | Grivna et al. | |
| 2012/0322241 | A1 * | 12/2012 | Holden | H01L 21/78 438/462 |
| 2014/0110835 | A1 * | 4/2014 | Ong | H01L 23/488 257/737 |

* cited by examiner

METHOD OF FORMING A SEMICONDUCTOR DEVICE AND STRUCTURE THEREFOR

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form metal bumps on semiconductor die. The metal bumps typically were applied onto connection areas of the semiconductor die and were utilized to interconnect areas on the semiconductor die to other structures that were external to the semiconductor die such as to other semiconductor die, printed circuit boards, ceramic substrates, or other types of structures. In one embodiment, the metal bumps were formed from solder or other material that was deposited onto the semiconductor die. In some cases, the solder was applied to the die prior to the die being singulated from a semiconductor wafer.

In some applications, portions of the metal bump could be removed during the process of singulating the semiconductor die from a semiconductor wafer which could make it difficult to attach the semiconductor die to the other structure.

Accordingly, it is desirable to have a method of forming a bump on a semiconductor die that reduces the amount of the bump material that is removed during die singulation, and/or to have a bump structure on a semiconductor die that more easily attaches to another structure.

Figure 1:
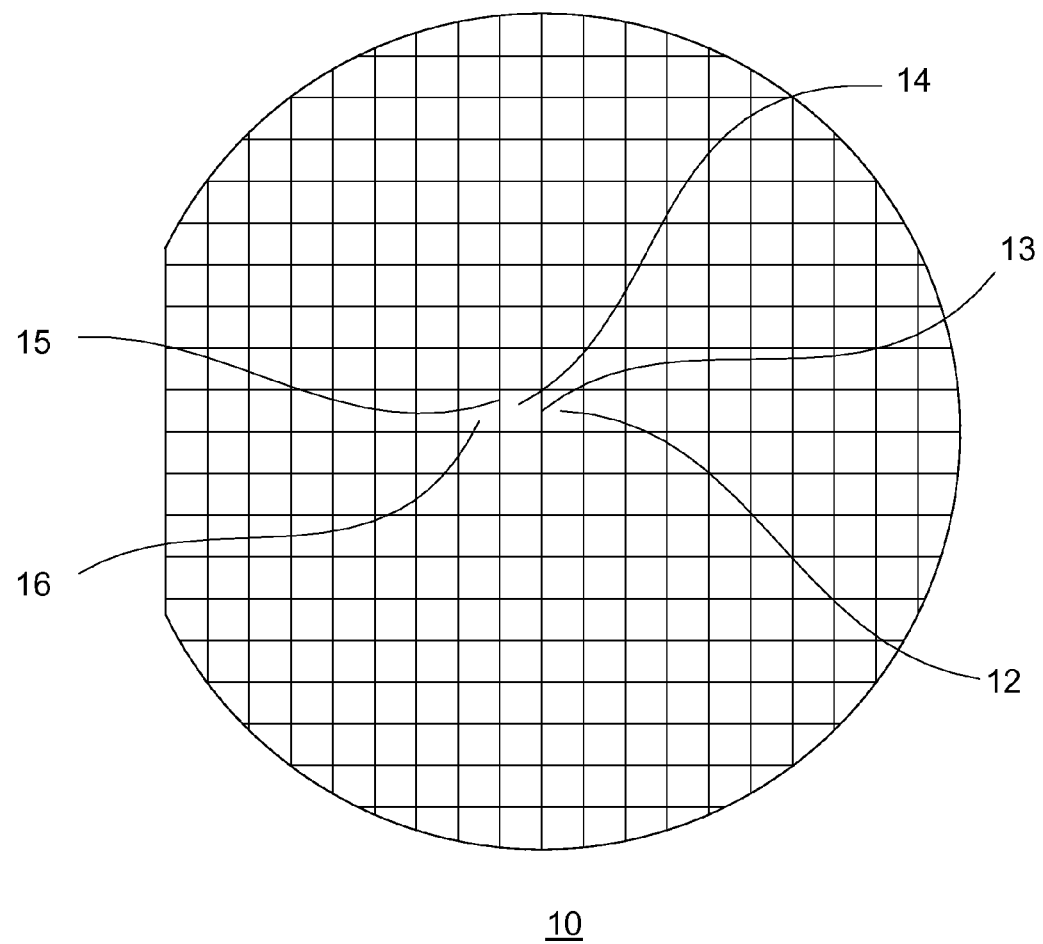
FIG. 1 illustrates a plan view of an example of an embodiment of a semiconductor wafer that includes a plurality of semiconductor die in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, and that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

FIG. 1 illustrates a plan view of an example of an embodiment of a semiconductor wafer 10 that includes a plurality of semiconductor die, such as die 12, 14, and 16 that are formed on a semiconductor substrate. The semiconductor die typically are separated from each other by singulation regions of the semiconductor wafer where the die are to be singulated from each other, for example by forming singulation openings through the underlying portions of wafer 10 or by cutting through wafer 10. In general terms, singulate relates to separating the die that are conjoined as the wafer into individual units or individual die from the wafer, either separating one die or a plurality of die from the wafer. Some singulation regions of wafer 10 are illustrated in a general manner by singulation lines, such as lines 13 and 15, where the die are to be singulated from each other. Those skilled in the art will appreciate that lines 13 and 15 may not necessary lines drawn on wafer 10 but represent regions of wafer 10 where the die are to be singulated from each other.

Those skilled in the art will also appreciate that the portion of the semiconductor wafer and semiconductor substrate underlying the singulation lines typically are not a portion of the resulting singulated semiconductor die.

Figure 2:
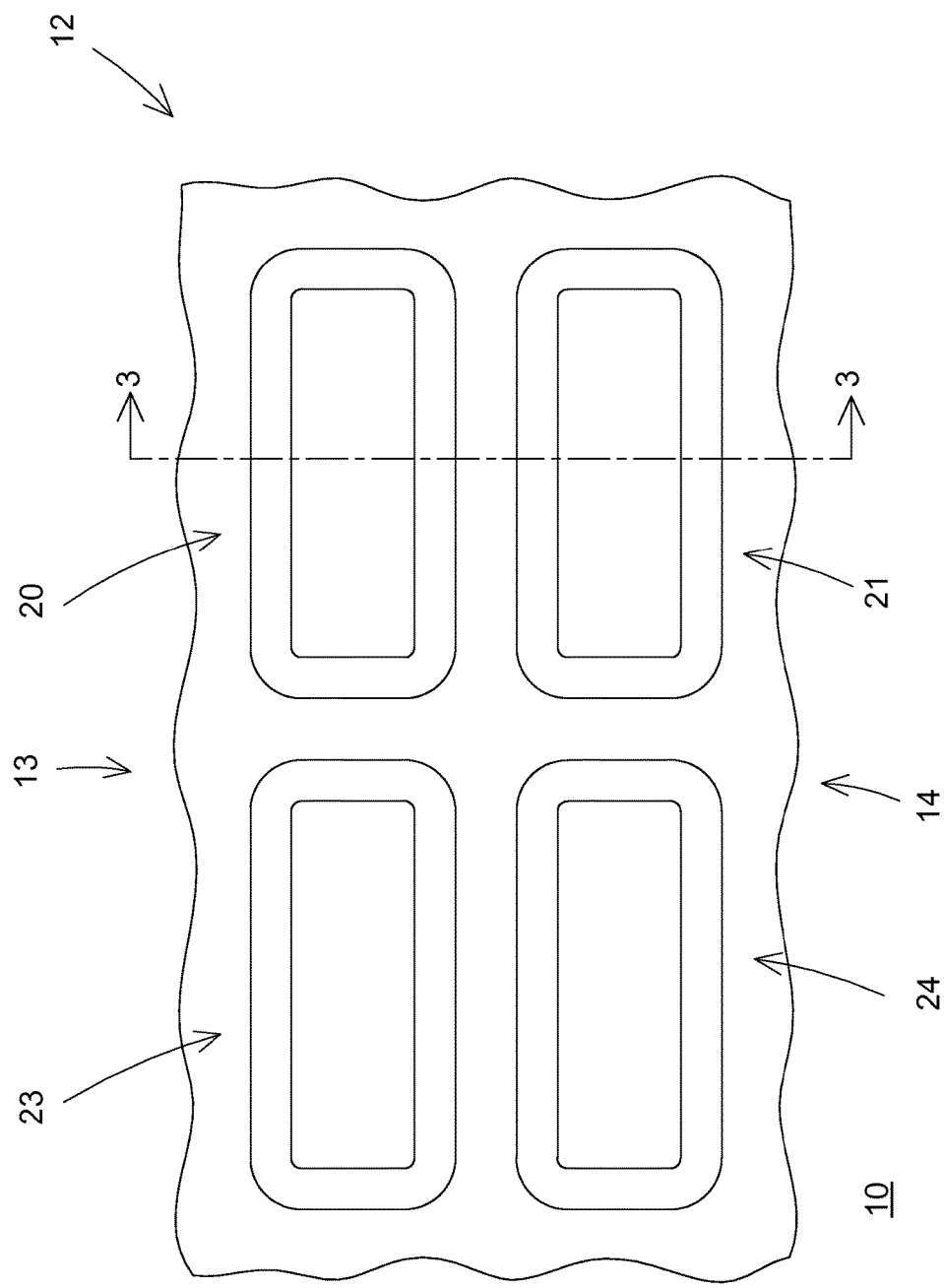
FIG. 2 illustrates an enlarged plan view of an example of an embodiment of a portion of the semiconductor wafer of FIG. 1 in accordance with the present invention.

FIG. 2 illustrates an enlarged plan view of an example of an embodiment of a portion of wafer 10 that includes a portion of singulation line 13 and a portion of die 12 and 14. Die 12 and 14 typically include connection regions that are utilized to interconnect die 12 and 14 to other structures. For example, die 12 may include bump structures 20 and 21 that facilitate forming an electrical connection between regions of die 12 and other structures. Die 14 may include bump structures 23 and 24 that are similar to structures 20 and 21. Those skilled in the art will appreciate that although die 12 and 14 are illustrated to include two bump structures, other die embodiments may have only one or may have more than two bump structures. Although bump structures 20-21 and 23-24 are illustrated as having an oblong shape, they may have other shapes in other embodiments including a circular or other shape.

Figure 3:
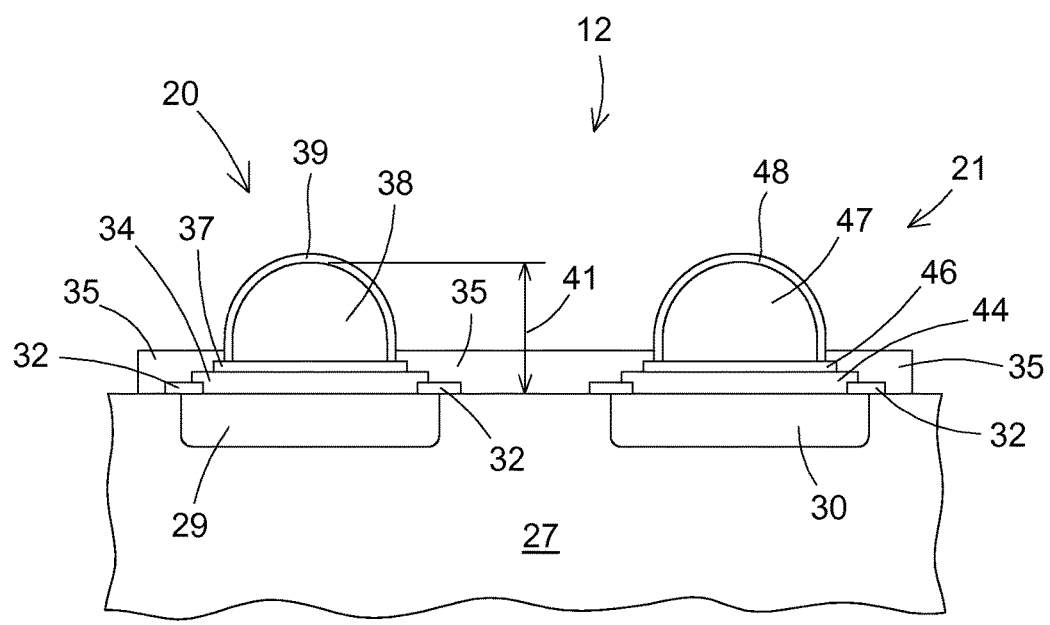
FIG. 3 illustrates an enlarged cross-sectional view of an example of an embodiment of a portion of the semiconductor wafer of FIG. 1 in accordance with the present invention.

FIG. 3 illustrates an enlarged cross-sectional view of an example of an embodiment of a portion of die 12 of wafer 10 taken along cross-section line 3-3 illustrated in FIG. 2. This description has references to FIG. 2 and FIG. 3.

Die 12 and 14 typically are formed on a semiconductor substrate 27 that usually is a portion of wafer 10. Those skilled in the art will appreciate that in some embodiments substrate 27 may include a bulk semiconductor substrate onto which other semiconductor layers are formed. For example, substrate 27 may include a bulk semiconductor substrate on which one or more epitaxial layers are formed, or may include one bulk substrate wafer bonded to another bulk substrate, or may include other semiconductor materials. In some embodiments, die 12 and 14 may include active regions (not shown) that are used for forming active devices on substrate 27. Die 12 and 14 may optionally include other doped regions, such as doped regions 29 and 30 of die 12 for example, that may be used for forming a low resistance electrical connection between elements of die 12 and 14 and structures that are external to die 12 and 14.

Die 12 and 14 may include an optional under bump conductor at the location where the bump structures, such as structures 20 and 21 of die 12 for example, may be formed. For example, an under bump conductor 34 may be formed where bump structure 20 is to be formed and an under bump conductor 44 may be formed where bump structure 21 is to be formed. Those skilled in the art will appreciate that under bump conductors 34 and 44 may be formed from a material that forms a low resistance contact, such as an ohmic contact for example, to substrate 27 or regions formed on substrate 27, such as regions 29 and 30 for example. Materials used for forming conductors 34 and 44 are well-known in the art and may include materials such as aluminum, an aluminum-silicon alloy, copper, an aluminum-copper alloy, a copper-silicon alloy, and other well-known conductor materials. In some embodiments, an optional barrier layer, such as barrier layers 37 and 46, may be formed on the surface of respective conductors 34 and 44 to prevent diffusion of conductor materials from respective structures 20 and 21 to conductors 34 and 44, and vice versa. The material used for layers 37 and 46 may be nickel, titanium, tungsten, a titanium-tungsten alloy, or other well-known materials that minimize diffusion of conductor materials. In one embodiment, layers 37 and 46 may be considered portions of conductors 34 and 44.

In some embodiments, at least some of the semiconductor die of a semiconductor wafer may be singulated from the semiconductor wafer by using an etching technique that forms an opening through at least a portion of the material of wafer 10 that may be underlying the singulation lines. Examples of such etching techniques for die singulation are described in U.S. Pat. Nos. 7,781,310, 7,989,319, and 8,012,857 which are hereby incorporated herein by reference. Such etching techniques may be referred to as plasma singulation or dry dicing. During such a singulation process, it may be possible that some of the material of a bump formed by a prior method or a prior bump structure may be removed.

As will be seen further hereinafter, bump structures 20-21 and 23-24 are formed to facilitate forming a low resistance electrical connection between elements of respective die 12 and 14 and other external structures and to protect the bump structure or alternately to minimize the amount of the bump conductor that may be removed. In some embodiments, the surface of substrate 27 may have an insulator or a dielectric, such as an insulator 32, that may be formed on portions of the surface of substrate 27. For example, some embodiments of insulator 32 may include a field oxide layer or another type of insulator overlying certain regions of die 12. Typically, an opening may be formed through insulator 32 within the region where structures 20 and 23 are to be formed. Under bump conductors 34 and 44 may be formed in these openings, for example on the surface of substrate 27 or respective regions 29 and 30. In a non-limiting example, a conductor material may be applied to the surface of substrate 27 and patterned in order to form conductors 34 and 44.

In some embodiments, an optional passivation layer 35 may be formed on wafer 10 and overlying at least portions of die 12 and 14 to reduce contaminating die 12 and 14 with materials external to die 12 and 14. Those skilled in the art will appreciate that a passivation layer is different from an insulator that is used to separate conductors of die 12 and 14, such as different from an inter-layer insulator, and different from a field oxide region, and different from insulator 32, and in some example embodiments the passivation layer may include silicon nitride. An embodiment may include that passivation layer 35 may be formed over the surface of substrate 27 and patterned to form openings that expose portions of under bump conductors 34 and 44. The portion of layer 35 that may be within the singulation regions, such as singulation line 13, may or may not be removed during the patterning of layer 35. In one non-limiting example embodiment, layer 35 may abut conductor 34 or 44. In other embodiments, layer 35 may be omitted or may be in a different location. In one non-limiting embodiment, a portion of insulator 32 or another similar insulator may abut one or both of conductors 34 and 44.

A conductor bump may be formed on the under bump conductor. For example, conductor bumps 38 and 47 may be formed on respective conductors 34 and 44. Bumps 38 and 47 typically are formed to extend a distance 41 from the surface of respective conductors 34 and 44. In one embodiment distance 41 may be between approximately five and thirty microns (5-30μ). In another embodiment, distance 41 may be approximately twenty-five microns (25μ) around a tolerance of approximately ten percent (10%). Another embodiment may include forming distance 41 no less than ten microns (10μ) from the surface of conductors 34 and 44. In another embodiment, bumps 38 and 47 may be formed on another portion of die 12 or on other material(s) and not on conductors 34 and 44. Bumps 38 and 47 may be formed from a conductor material that facilitates attaching die 12 to other structures that are external to die 12. Bumps 38 and 47 may be formed from a metal, a metal alloy, or other conductor material. In one non-limiting example embodiment, bumps 38 and 47 may be formed from a gold-tin alloy. A protective layer, such as protective layers 39 and 48, may be formed on portions of respective bumps 38 and 47. The material used for layers 39 and 48 may be a conductor and may be a material that is etched at a slower rate than the material of bumps 38 and 47 is etched by the etchant that is used to singulate a die, such as die 12 and 14 for example, from wafer 10 using a dry dicing singulation method. In one non-limiting example embodiment, the material of bumps 38 and 47 may be etched approximately two to one hundred (2-100) times faster than the material of layers 39 and 48. A non-limiting example embodiment may include that the etchant may be a fluorine based plasma. An embodiment may include that the material used for layers 39 and 48 may be a material that is etched at a slower rate than silicon is etched by the etchant that is used to singulate die 12 and/or 14 from wafer 10 using a dry dicing singulation method. In a non-limiting example embodiment, the material of substrate 27 may be etched approximately ten (10) times faster than the material of layers 39 and 48.

Subsequently, die 12 and 14 may be singulated from wafer 10 by etching an opening through wafer 10 such as in the region identified by singulation line 13. It is believed that the material of layers 39 and 48 may be etched slower than the material of bumps 38 and 47 during the etching operation that is used to singulate die 12 and 14. Those skilled in the art will appreciate that other etching operations may be used to clean wafer 10 prior to or subsequent to the etching operation used to singulate die 12 and 14. Typically, the thickness of layers 39 and 48 is chosen such that a portion of layers 39 and 48 remain after die 12 and 14 are singulated from wafer 10. In one non-limiting example embodiment, the material of bumps 38 and 47 could be formed from a gold-tin alloy containing approximately ten to ninety five percent (10%-95%) tin by weight. In one embodiment, the material of layers 39 and 48 may each be a layer of gold having a thickness between approximately twenty five and one-hundred nano-meters (25 and 100 nm). In an embodiment, the material of layers 39 and 48 may include an alloy. In another non-limiting example embodiment, the material of bumps 38 and 47 could be formed from a gold-tin alloy containing approximately fifteen to twenty percent (15 to 20%) gold by weight. In one example embodiment, the remaining gold from layers 39 and 48 may change the composition of the gold-tin alloy of structures 20 and 21 after die 12 is attached to the other structure. In other embodiments, the gold-to-tin ratio may be different and the thickness of layers 39 and 48 may also be different.

In one non-limiting example embodiment, approximately thirty nano-meters (30 nm) of the material of layers 39 and 48 may be removed during the singulation operation. In other embodiments, layers 39 and 48 may be completely removed during the singulation operation.

Other embodiments may include that the material used for bumps 38 and 47 along with the material used for layers 39 and 48 form structures 20 and 21 to have a liquidus temperature of approximately two hundred to three hundred fifty (200-350) degrees Celsius. In another embodiment, layers 39 and 48 may be formed from other substantially inert materials including platinum or palladium. In other embodiments, bumps 38 and 47 may be formed from other material such as a tin-antimony alloy. One non-limiting example embodiment may include that the antimony content of the tin-antimony alloy may be approximately five to twenty percent (5-20%) by weight. One embodiment may include that bumps 38 and 47 may include a tin-silver alloy.

In another example embodiment, barrier layers 39 and 48 may be formed from tin. It is believed that tin may etch faster than gold but still may etch at a slower rate than the material of bumps 38 and 47 or at a slower rate than the silicon of substrate 27. The thickness of the tin may be large enough that the singulation process does not remove all of the tin material or may remove all of the tin material and a small amount of the material of bumps 38 and 47, for example less than ten percent (10%) and preferably less than one percent (1%).

In one embodiment, die 12 (or die 14) may be flipped such that structure 20 is positioned on a structure to which die 12 is to be attached. The combination of die 12 and the other structure may be heated such that the material of structure 20 attaches to the other structure.

In one embodiment, the heat reflows the material of structure 20 so that structure 20 forms a eutectic bond to a portion of the other structure. During the reflow operation the material of layer 39 mixes with the material of bump 38 to form the resulting ratio of the conductor(s) in the resulting alloy. Barrier layer 39 and/or 48 minimizes the amount of material removed from bumps 38 and 47 during the singulation operation which facilitates the bump structure forming a strong mechanical and a low resistance electrical connection to the other structure.

Those skilled in the art will appreciate that in one embodiment, a method of forming a semiconductor device may comprise:

providing a semiconductor wafer (such as a wafer 10 for example) that includes a semiconductor substrate (such as a substrate 27 as a non-limiting example), the semiconductor wafer having a plurality of semiconductor die (for example one of or both of 12 and/or 14) formed on the semiconductor substrate and separated from each other by singulation regions (such as a region 13 for example) wherein the plurality of semiconductor die include an under bump conductor (such as for example a conductor 34 and/or 44) and wherein the plurality of semiconductor die also include one of an insulator (for example insulator 32) or a passivation layer (such as for example a passivation layer 35) abutting the under bump conductor and overlying a portion of a surface of the semiconductor wafer;

forming a conductor bump (such as for example bump 38 and/or 47) on the under bump conductor and extending a first distance away from a surface of the under bump conductor; and forming a protective layer on an outer surface of the conductor bump including forming the protective layer as a first material that protects the conductor bump from an etchant used to singulate the semiconductor die.

Another embodiment of the method may include forming the conductor bump as a metal alloy and wherein forming the protective layer includes forming the first material of the protective layer to include one material of the metal alloy.

An embodiment may include forming the protective layer from a material that includes gold with the protective layer covering the conductive bump.

In an embodiment the method may include forming the protective layer as a layer of gold covering the conductive bump and having a thickness of between 25 and 150 nano-meters.

An embodiment may include forming the conductor bump as a metal alloy and wherein forming the protective layer includes forming the first material of the protective layer including a metal that is not a constituent of the metal alloy.

Another embodiment may include forming the first distance of the conductor bump to be greater than a thickness of the under bump conductor.

An embodiment of the method may include forming the conductor bump from a second material that is different from a third material of the under bump conductor.

In an embodiment, the method may also include forming a barrier layer on the under bump conductor wherein the barrier layer is a portion of the under bump conductor.

An embodiment may include forming the protective layer from the first material that is etched at a slower rate than the conductor bump by the etchant that etches the semiconductor substrate wherein the etchant is used to singulate the plurality of semiconductor die from the semiconductor wafer.

Those skilled in the art will appreciate that a semiconductor device may comprise:

a semiconductor substrate having active elements formed on the semiconductor substrate; an under bump conductor used to make an electrical connection to the active elements; a conductive bump formed on the under bump conductor, the conductive bump including a first material; and a protective layer formed on a surface of the conductive bump wherein the protective layer includes a second material that is etched at a slower rate than the first material by an etchant that etches semiconductor material of the semiconductor substrate.

In another embodiment, the semiconductor device may include that the first material may be an alloy and the second material may be one material of the alloy.

Another embodiment may include that the alloy includes an alloy that includes one of a gold and tin alloy having approximately fifteen to twenty percent tin or an antimony and tin alloy having approximately five to fifteen percent tin.

An embodiment may include that the under bump conductor includes a barrier layer on the first material.

In an embodiment, the semiconductor device may include that the protective layer includes an inert conductor material.

Those skilled in the art will appreciate that a method of forming a semiconductor device may comprise:

providing a semiconductor wafer that includes a semiconductor substrate, the semiconductor wafer having a plurality of semiconductor die formed on the semiconductor wafer and separated from each other by at least one singulation region; forming a conductor bump on the semiconductor die and extending a first distance away from a surface of the semiconductor die; and forming a protective layer on an outer surface of the conductor bump wherein the plurality of semiconductor die are subsequently singulated by etching through the semiconductor substrate with an etchant and wherein the protective layer protects the conductor bump from the etchant.

An embodiment of the method may include forming the protective layer includes forming the protective layer as a layer of tin covering the conductor bump.

One embodiment of the method may include providing the semiconductor die including an under bump conductor and including one of a passivation layer or an insulator abutting the under bump conductor and wherein the passivation layer is overlying a portion of a surface of the semiconductor substrate.

An embodiment may include forming the protective layer wherein a thickness of the protective layer is reduced by the etchant.

In view of all of the above, it is evident that a novel device and method is disclosed. Included, among other features, is forming a bump structure that includes a barrier layer on a conductor bump. The barrier layer is etched at a slower rate than the material of the bump would be etched by an etchant that may be used to singulate a semiconductor die from a semiconductor wafer. The resulting bump structure facilitates forming a strong mechanical and a low resistance electrical connection between elements of die 12 and/or 14 and the other structure to which die 12 and/or 14 are to be attached.

While the subject matter of the descriptions are described with specific preferred embodiments and example embodiments, the foregoing drawings and descriptions thereof depict only typical examples of embodiments of the subject matter and are not therefore to be considered to be limiting of its scope, it is evident that many alternatives and variations will be apparent to those skilled in the art. As will be appreciated by those skilled in the art, the example form of structures 20 and 21 may be different than the explained example embodiments as long as material of layers 39 and 48 reduce the amount of material that is removed from bumps 38 and 47 during the die singulation operation.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a semiconductor device comprising:
providing a semiconductor wafer that includes a semiconductor substrate, the semiconductor wafer having a plurality of semiconductor die formed on the semiconductor substrate and separated from each other by singulation regions wherein the plurality of semiconductor die include an under bump conductor and wherein the plurality of semiconductor die also include one of an insulator or a passivation layer abutting and covering sidewalls of the under bump conductor and overlying a portion of a surface of the semiconductor wafer;
forming a conductor bump on the under bump conductor and extending a first distance away from a surface of the under bump conductor; and
subsequently forming a protective layer on an outer surface of the conductor bump including forming the protective layer as a first conductor material that protects the conductor bump from an etchant used to singulate the semiconductor die wherein the etchant removes a portion of the first material.

2. The method of claim 1 wherein forming the conductor bump includes forming the conductor bump as a metal alloy and wherein forming the protective layer includes forming the first material of the protective layer to include one material of the metal alloy.

3. The method of claim 2 wherein forming the conductor bump includes forming the conductor bump from a gold-tin alloy and forming the protective layer from only gold with the protective layer covering the conductive bump.

4. The method of claim 3 wherein forming the protective layer includes forming the protective layer having a thickness of between 25 and 150 nano-meters.

5. The method of claim 1 wherein forming the conductor bump includes forming the conductor bump as a metal alloy and wherein forming the protective layer includes forming the first material of the protective layer including a metal that is not a constituent of the metal alloy.

6. The method of claim 1 wherein forming the conductor bump includes forming the first distance of the conductor bump to be greater than a thickness of the under bump conductor.

7. The method of claim 1 wherein forming the conductor bump includes forming the conductor bump from a second material that is different from a third material of the under bump conductor.

8. The method of claim 1 further including forming a barrier layer on the under bump conductor wherein the barrier layer is a portion of the under bump conductor.

9. A method of forming a semiconductor device comprising:
provided a semiconductor wafer that includes a semiconductor substrate, the semiconductor wafer having a plurality of semiconductor die formed on the semiconductor substrate and separated from each other by singulation regions wherein a semiconductor die of the plurality of semiconductor die includes an under bump conductor and wherein the semiconductor die also includes one of an insulator or a passivation layer abutting the under bump conductor and overlying a portion of a surface of the semiconductor wafer;
forming a conductor bump on the under bump conductor and extending a first distance away from a surface of the under bump conductor; and
forming a protective layer on an outer surface of the conductor bump wherein a width of the protective layer is less than a width of the under bump conductor including forming the protective layer as a first material that protects the conductor bump from an etchant used to singulate the semiconductor die including forming the protective layer from the first material that is etched by the etchant that etches the semiconductor substrate but etched at a slower rate than the conductor bump wherein the etchant is used to singulate the plurality of semiconductor die from the semiconductor wafer.

10. A method of forming a semiconductor device comprising:
providing a semiconductor wafer that includes a semiconductor substrate, the semiconductor wafer having a plurality of semiconductor die formed on the semiconductor wafer and separated from each other by at least one singulation region wherein a semiconductor die of the plurality of semiconductor die includes an under bump conductor;
forming a conductor bump on the semiconductor die and extending a first distance away from a surface of the semiconductor die; and
forming a protective layer on an outer surface of the conductor bump wherein a width of the protective layer is less than a width of the under bump conductor and wherein the plurality of semiconductor die are subsequently singulated by etching through the semiconductor substrate with an etchant and wherein the etching removes a portion of the protective layer.

11. The method of claim 10 wherein forming the protective layer includes forming as a layer of tin covering the conductor bump.

12. The method of claim 10 wherein providing the semiconductor wafer that includes the semiconductor substrate includes one of a passivation layer or an insulator abutting the under bump conductor and wherein the passivation layer is overlying a portion of a surface of the semiconductor substrate.

13. The method of claim 10 wherein forming the protective layer includes forming the protective layer wherein a thickness of the protective layer is reduced by the etchant.

* * * * *

UNITED STATES PATENT AND TRADEMARK OFFICE
CERTIFICATE OF CORRECTION

PATENT NO. : 9,646,951 B2  
APPLICATION NO. : 14/102047  
DATED : May 9, 2017  
INVENTOR(S) : Richard D. Moyers et al.

Page 1 of 1

It is certified that error appears in the above-identified patent and that said Letters Patent is hereby corrected as shown below:

In the Claims

In Column 8, Line 55, after the word "first" insert -- conductor --;  
In Column 8, Line 59, after the word "first" insert -- conductor --; and  
In Column 9, Line 4, after the word "first" insert -- conductor --.

Signed and Sealed this  
Twenty-fifth Day of June, 2019

Andrei Iancu  
*Director of the United States Patent and Trademark Office*